(12) United States Patent
Onaka et al.

(10) Patent No.: US 11,146,303 B2
(45) Date of Patent: Oct. 12, 2021

(54) ANTENNA MODULE

(71) Applicant: Murata Manufacturing Co., Ltd., Kyoto (JP)

(72) Inventors: Kengo Onaka, Kyoto (JP); Yoshiki Yamada, Kyoto (JP); Keisei Takayama, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/732,758

(22) Filed: Jan. 2, 2020

(65) Prior Publication Data

US 2020/0145038 A1 May 7, 2020

Related U.S. Application Data

(63) Continuation of application No. PCT/JP2018/018898, filed on May 16, 2018.

(30) Foreign Application Priority Data

Jul. 6, 2017 (JP) .............................. JP2017-132788

(51) Int. Cl.
*H01Q 1/38* (2006.01)
*H01Q 1/48* (2006.01)
(Continued)

(52) U.S. Cl.
CPC .............. *H04B 1/40* (2013.01); *H01Q 1/48* (2013.01); *H01Q 9/045* (2013.01);
(Continued)

(58) Field of Classification Search
None
See application file for complete search history.

(56) References Cited

U.S. PATENT DOCUMENTS 4,401,988 A * 8/1983 Kaloi .................. H01Q 19/005
343/700 MS
4,835,538 A 5/1989 McKenna et al.
(Continued)

FOREIGN PATENT DOCUMENTS

JP S63-88904 A 4/1988
JP S63-189002 A 8/1988
(Continued)

OTHER PUBLICATIONS

International Search Report for International Application No. PCT/JP2018/018898 dated Aug. 7, 2018.
(Continued)

*Primary Examiner* — Tuan A Tran
(74) *Attorney, Agent, or Firm* — Pearne & Gordon LLP

(57) ABSTRACT

An antenna module includes a substrate, a RF signal processing circuit provided on the substrate, a ground electrode provided on the substrate above the RF signal processing circuit, a radiation electrode provided on the substrate above the ground electrode, and a feed line provided in an overlapping area where the radiation electrode and the RF signal processing circuit overlap, the feed line connecting the radiation electrode and the RF signal processing circuit, wherein the ground electrode includes a first ground pattern, a second ground pattern, and a peripheral wall connecting the first ground pattern and the second ground pattern, the peripheral wall surrounds part of the feed line, and the second ground pattern has a through hole through which the feed line penetrates.

19 Claims, 12 Drawing Sheets

(51) Int. Cl.
  *H04B 1/40* (2015.01)
  *H01Q 9/04* (2006.01)
  *H01Q 21/06* (2006.01)
  *H03F 3/19* (2006.01)

(52) U.S. Cl.
  CPC ............ *H01Q 21/065* (2013.01); *H03F 3/19* (2013.01); *H03F 2200/451* (2013.01)

(56) References Cited

U.S. PATENT DOCUMENTS

| | | | |
|---|---|---|---|
| 7,592,957 B2* | 9/2009 | Achour | H01Q 1/38 343/700 MS |
| 7,675,474 B2* | 3/2010 | Shtrom | H01Q 21/245 343/853 |
| 7,804,455 B2* | 9/2010 | Lee | H01Q 21/245 343/725 |
| 8,368,484 B2* | 2/2013 | Uejima | H03H 7/463 333/101 |
| 8,384,598 B2* | 2/2013 | Harihara | H01Q 1/38 343/700 MS |
| 8,619,805 B2* | 12/2013 | Flammer, III | H04W 74/0808 370/445 |
| 8,742,993 B2* | 6/2014 | Lee | H01Q 9/42 343/700 MS |
| 8,791,865 B2* | 7/2014 | Su | H01Q 1/38 343/702 |
| 9,190,732 B2* | 11/2015 | Fujii | H01Q 1/38 |
| 9,190,735 B2* | 11/2015 | Xu | H01Q 15/008 |
| 9,276,104 B2* | 3/2016 | Tsunemi | H01L 23/481 |
| 9,866,074 B2* | 1/2018 | Zeine | H02J 50/40 |
| 9,866,265 B2* | 1/2018 | Saji | H01L 24/19 |
| 9,887,465 B2* | 2/2018 | Gummalla | H01Q 15/08 |
| 9,929,886 B2* | 3/2018 | Amadjikpe | H01Q 9/0407 |
| 2005/0195110 A1* | 9/2005 | Lin | H01Q 9/0414 343/700 MS |
| 2008/0218418 A1 | 9/2008 | Gillette | |
| 2012/0003946 A1* | 1/2012 | Ono | H01Q 3/30 455/115.1 |
| 2016/0172753 A1* | 6/2016 | Tai | H04B 1/3838 455/418 |
| 2017/0222316 A1 | 8/2017 | Mizunuma et al. | |
| 2018/0205155 A1 | 7/2018 | Mizunuma et al. | |

FOREIGN PATENT DOCUMENTS

| | | | | |
|---|---|---|---|---|
| JP | 06037532 | * | 2/1994 | ............ H01Q 13/08 |
| JP | H06-37532 A | | 2/1994 | |
| JP | H09-64636 A | | 3/1997 | |
| JP | 2013223000 | * | 10/2013 | ............ H01Q 23/00 |
| WO | 2016/063759 A1 | | 4/2016 | |
| WO | 2017/047396 A1 | | 3/2017 | |

OTHER PUBLICATIONS

Written Opinion for International Application No. PCT/JP2018/018898 dated Aug. 7, 2018.

* cited by examiner

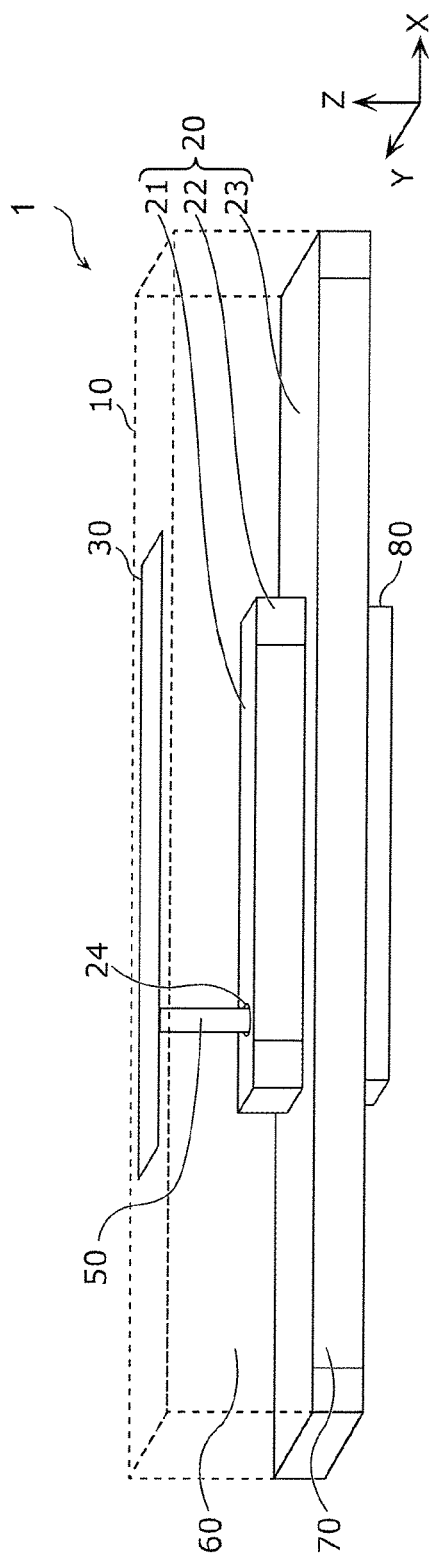

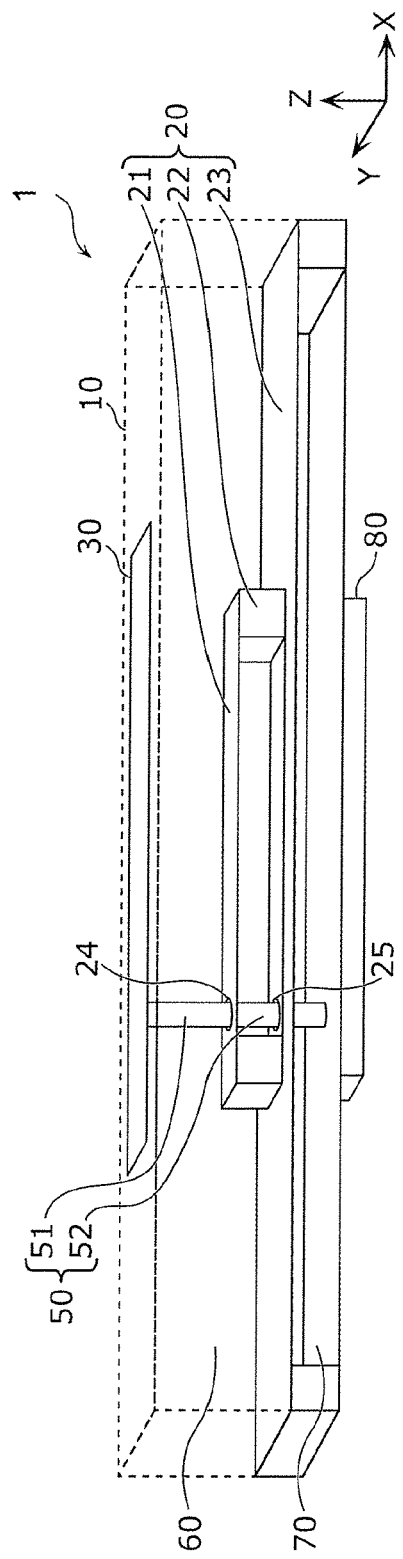

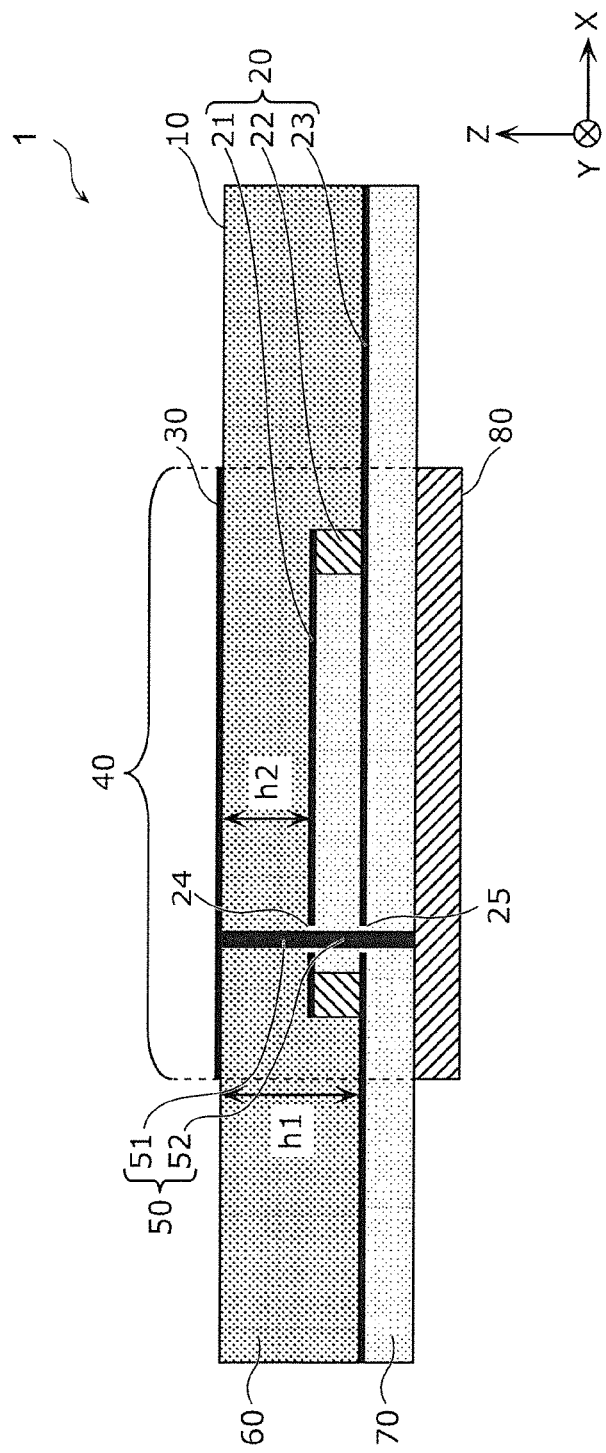

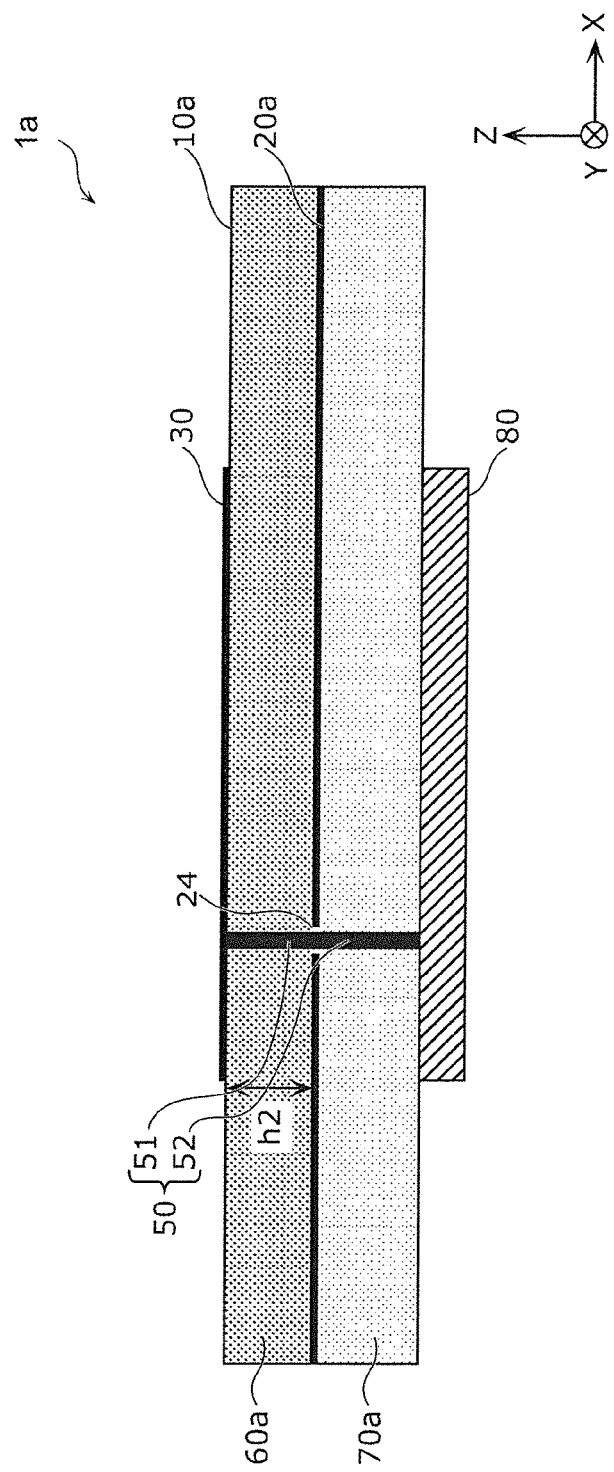

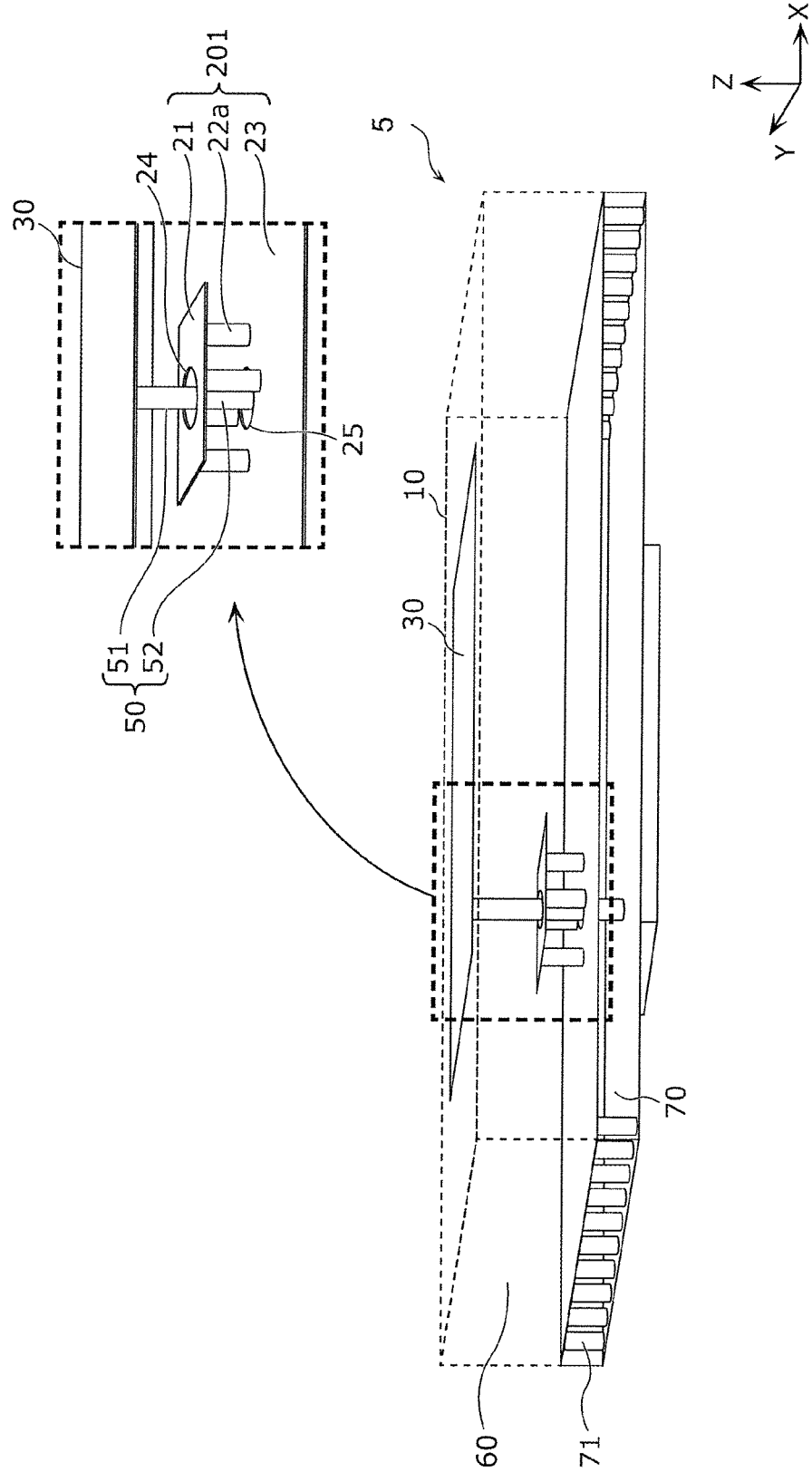

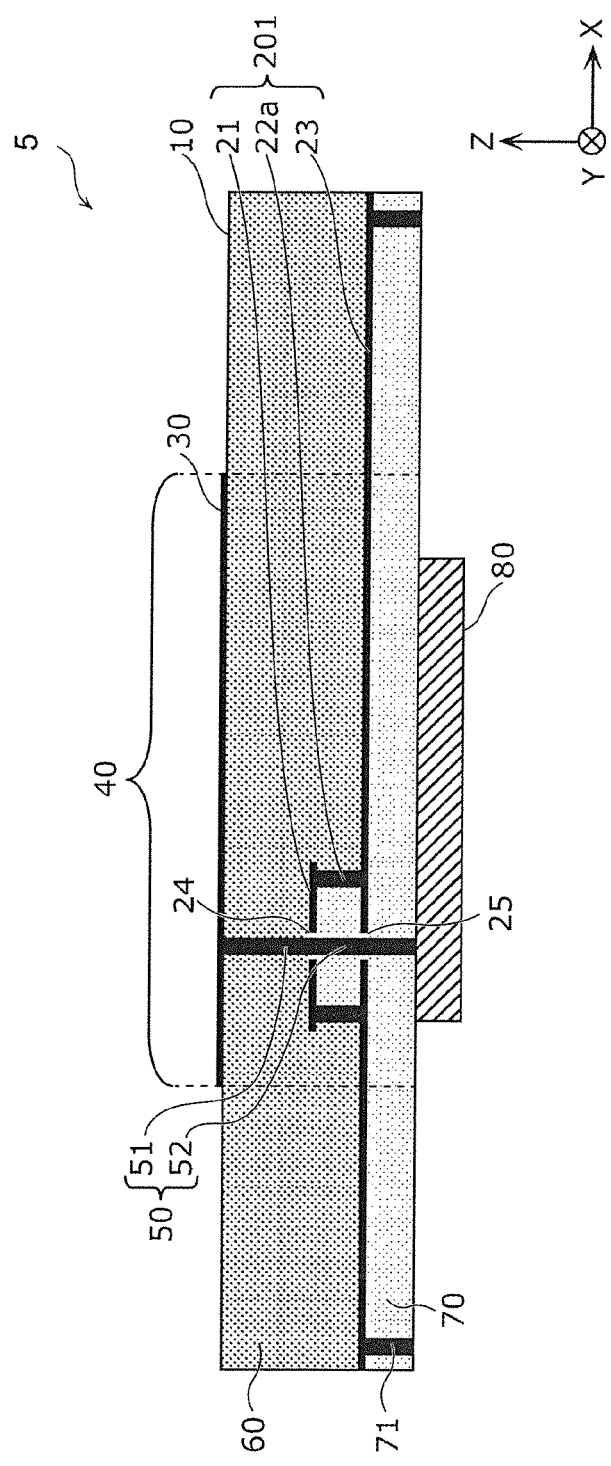

ANTENNA MODULE

This is a continuation of International Application No. PCT/JP2018/018898 filed on May 16, 2018 which claims priority from Japanese Patent Application No. 2017-132788 filed on Jul. 6, 2017. The contents of these applications are incorporated herein by reference in their entireties.

BACKGROUND OF THE DISCLOSURE

Field of the Disclosure

The present disclosure relates to antenna modules.

Description of the Related Art

Recently, there has been the demand for size reduction of mobile phones or the like. In response to this, an antenna module is disclosed (for example, patent document 1), in which a radiation electrode (antenna) and a RF signal processing circuit that feeds a radio frequency signal to the radiation electrode via a feed line are unified. In such an antenna module, the radiation electrode and the RF signal processing circuit are unified by providing the radiation electrode on one of the principal surfaces of a substrate and by providing the RF signal processing circuit on the other principal surface.

Patent Document 1: International Publication No. 2016/063759

BRIEF SUMMARY OF THE DISCLOSURE

Here, in the foregoing prior art antenna module, it is required to make the feed line from the RF signal processing circuit to the radiation electrode shorter. This is to suppress transmission line loss as much as possible. Further, this is also to suppress degradation of cross polarization discrimination (XPD) due to an influence of polarization in a substrate thickness direction originated from the feed line in an array antenna in which radiation electrodes are arranged in an array. On the other hand, in the case where the feed line is shortened by thinning the thickness of a substrate in the antenna module, the radiation electrode and a ground electrode provided on the substrate are likely to be close to each other. This reduces the distance between an edge portion of the radiation electrode and the ground electrode and degrades antenna characteristics (particularly, bandwidth).

The present disclosure is made to resolve the foregoing issue and provides an antenna module that enables to suppress the influence of polarization in the substrate thickness direction originated from the feed line while maintaining the antenna characteristics.

An antenna module according to one aspect of the present disclosure includes: a substrate; a RF signal processing circuit provided on the substrate; a ground electrode provided on the substrate above the RF signal processing circuit; a radiation electrode provided on the substrate above the ground electrode in such a manner as to overlap with the RF signal processing circuit at least partially in a plan view of the substrate; and a feed line provided in an overlapping area where the radiation electrode and the RF signal processing circuit overlap, the feed line connecting the radiation electrode and the RF signal processing circuit, wherein the ground electrode includes a first ground pattern, a second ground pattern provided above the first ground pattern and within the first ground pattern in the plan view, and at least one ground conductor that connects the first ground pattern and the second ground pattern, the at least one ground conductor surrounds part of the feed line, and the second ground pattern has a through hole through which the feed line penetrates.

According to this, when the ground electrode of the present aspect and a prior art ground electrode that has a flat face at the height of the second ground pattern of the ground electrode of the present aspect are compared, the distance between the first ground pattern of the ground electrode and the radiation electrode can be made longer in the ground electrode of the present aspect. As a result, the density of lines of electric force decreases, and the antenna characteristic (bandwidth) improves. Accordingly, the thickness of the substrate can be reduced (that is, the feed line can be shortened) by the amount of improvement in the antenna characteristic. This enables to suppress the influence of polarization in the substrate thickness direction originated from the feed line while maintaining the antenna characteristic of a prior art antenna module.

At this time, it is conceivable to make the ground electrode of the prior art antenna module have a flat face at the height of the first ground pattern instead of the height of the second ground pattern of the ground electrode of the present aspect. In this case, however, when compared with the ground electrode in which part of the feed line is covered with the at least one ground conductor and the second ground pattern, a feed line existing on the side closer to the radiation electrode than the ground electrode becomes longer. The polarization in the substrate thickness direction originated from the feed line existing on the side closer to the RF signal processing circuit than the ground electrode is shielded by the ground electrode, thereby causing less influence on the radiation electrode. Whereas, in the case where the feed line existing on the side closer to the radiation electrode than the ground electrode becomes longer, the influence on the radiation electrode due to the polarization in the substrate thickness direction originated from the feed line becomes larger. Accordingly, as the part of the feed line covered by the ground electrode with the at least one ground conductor and the second ground pattern increases, the feed line existing on the side closer to the radiation electrode than the ground electrode becomes shorter, thereby enabling to suppress the influence of polarization in the substrate thickness direction originated from the feed line.

Note that "enabling to suppress the influence of polarization in the substrate thickness direction originated from the feed line while maintaining the antenna characteristic" means, in other words, "enabling to produce the advantageous effect of improving the antenna characteristic while maintaining the influence of polarization in the substrate thickness direction originated from the feed line".

Further, the second ground pattern may be provided only within the radiation electrode in the plan view.

According to this, in the case where the second ground pattern, which is close to the radiation electrode, is expanded to the outside of the radiation electrode in the plan view of the substrate, the distance between the ground electrode and the edge portion of the radiation electrode becomes shorter, and this hinders the improvement of the antenna characteristic. Accordingly, by providing the second ground pattern only within the radiation electrode in the plan view of the substrate, the distance between the ground electrode and the edge portion of the radiation electrode is secured, and the antenna characteristic improves. As a result, the feed line can be further shortened, and the influence of the polarization in the substrate thickness direction originated from the feed line can be further suppressed.

Note that the size of the second ground pattern can be expanded close to the edge portion of the radiation electrode in the plan view of the substrate to the extent that the antenna characteristic does not degrade. Further, the at least one ground conductor is connected to an outer edge portion of the second ground pattern that has been expanded close to the edge portion of the radiation electrode. Although the wiring area in which wiring for the RF signal processing circuit is provided is necessary for the substrate, the area covered by the second ground pattern and the at least one ground conductor becomes larger by expanding the size of the second ground pattern close to the edge portion of the radiation electrode, and in that area, the wiring area can be secured while improving the antenna characteristic.

Further, the antenna module may include a plurality of the radiation electrodes, and the plurality of radiation electrodes may be arranged on the substrate in an array.

This enables to provide the antenna module including an array antenna that facilitates the control of the antenna directivity. Note that the degradation of XPD can be suppressed because this array antenna enables to suppress the polarization in the substrate thickness direction originated from the feed line.

Further, the RF signal processing circuit may be provided within the substrate.

This enables further downsizing (lowering of profile height) of the antenna module.

Further, the radiation electrode may be made up of a feed element connected to the feed line and a parasitic element provided above the feed element.

This enables to increase the antenna directivity.

Further, a material of the substrate between the feed element and the parasitic element may be different from a material of the substrate between the feed element and the ground electrode.

This enables to make the thermal expansion coefficient in between the feed element and the parasitic element different from the thermal expansion coefficient in between the feed element and the ground electrode. Accordingly, warping of the substrate is alleviated, and the coplanarity of the substrate can be improved.

Further, in the antenna module according to one aspect of the present disclosure, the RF signal processing circuit includes a phase shifter circuit that shifts a phase of a radio frequency signal, an amplifier circuit that amplifies a radio frequency signal whose phase has been shifted, and a switching element that switches between feeding and not feeding of a radio frequency signal that has been amplified to the radiation electrode.

This enable the realization of a multiband/multimode antenna module.

The antenna module according to the present disclosure enables to suppress the influence of polarization in the substrate thickness direction originated from the feed line while maintaining the antenna characteristic.

BRIEF DESCRIPTION OF THE SEVERAL VIEWS OF THE DRAWINGS

FIG. 1A is an external perspective view of an antenna module according to an embodiment 1.

FIG. 1B is an external perspective view of the antenna module according to the embodiment 1, part of which is made transparent.

FIG. 1C is a cross-sectional view of the antenna module according to the embodiment 1.

FIG. 2 is a cross-sectional view of an antenna module according to a comparison example.

FIG. 9A is an external perspective view of an antenna module according to another embodiment.

FIG. 9B is a cross-sectional view of the antenna module according to another embodiment.

DETAILED DESCRIPTION OF THE DISCLOSURE

Figure 3:
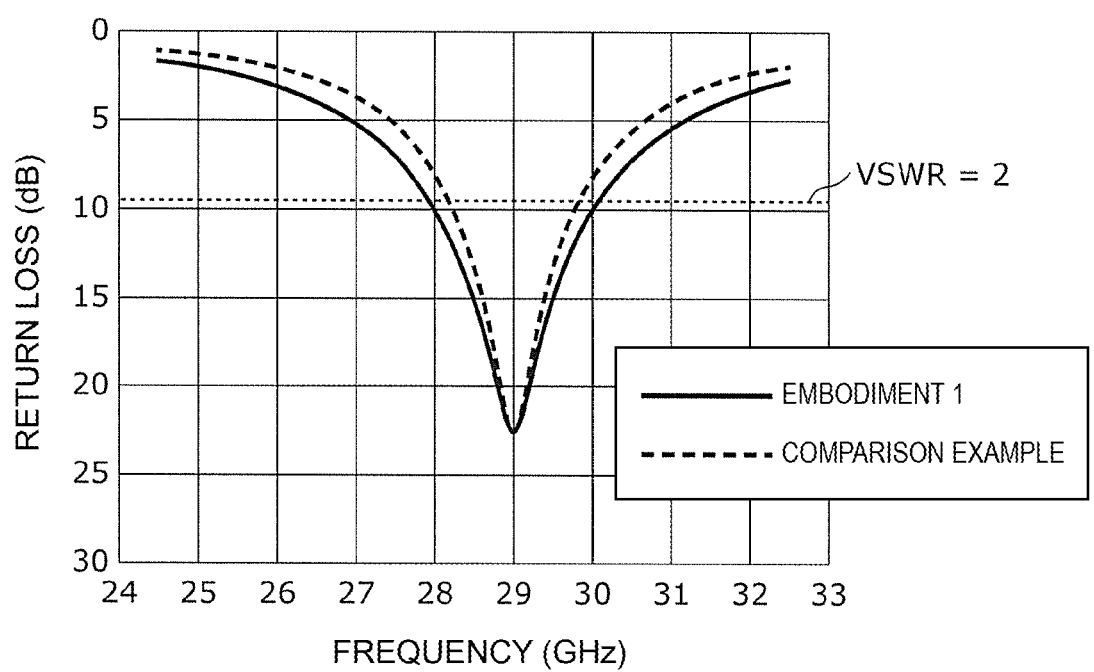
FIG. 3 is a diagram illustrating an antenna characteristic of the embodiment 1 and an antenna characteristic of the comparison example.

Hereinafter, embodiments of the present disclosure will be described in detail with reference to the drawings. Note that the embodiments which will be described below each illustrate a comprehensive or specific example. Numeric values, shapes, materials, constituting elements, arrangements and connection modes of the constituting elements, and the like described in the following embodiments are mere examples, and not intended to limit the present disclosure. Of the constituting elements in the following embodiments, the constituting elements that are not described in an independent claim will be described as optional constituting elements. Further, dimensions or ratios of the dimensions of constituting elements illustrated in the drawings are not necessarily be precise. Further, in the drawings, the same reference code is given to substantially the same constituting element, and in some cases an overlapping description is omitted or simplified. Further, in the following embodiments, the term "connect" includes not only the case where the connection is made directly but also includes the case where the connection is made electrically via another element or the like.

Embodiment 1

[1. Configuration of Antenna Module]

FIG. 1A is an external perspective view of an antenna module 1 according to an embodiment 1. In FIG. 1A, for clarification of the inside of an antenna area 60 in a substrate 10 which will be described below, the antenna area 60 is made transparent, and edge portions thereof are illustrated by the dashed line. FIG. 1B is an external perspective view of the antenna module 1 according to the embodiment 1, part of which is made transparent. Similarly, in FIG. 1B, the antenna area 60 is made transparent, and the edge portions thereof are illustrated by the dashed line. Further, in FIG. 1B, a peripheral wall 22 of a ground electrode 20, which will be described below, is made transparent on the minus direction side (a direction opposite to the arrow) of the y-axis, and a wiring area 70 of the substrate 10, which will be described below, is made transparent on the minus direction side of the y-axis. FIG. 1C is a cross-sectional view of the antenna module 1 according to the embodiment 1. FIG. 1C is a cross-sectional view of the antenna module 1 cut along the x-z plane that goes through a feed line 50, which will be described below, and viewed from the minus direction of the y-axis. Note that the same applies to the following cross-sectional views which will be described below. Further, hereinafter, the plus direction (a direction of the arrow) of the z-axis is also referred to as "above".

The antenna module 1 is, for example, a module to be installed in a mobile phone or the like, and in this antenna module 1, a radio frequency circuit, an antenna, and the like are unified for the purpose of downsizing. As illustrated in FIG. 1A to FIG. 1C, the antenna module 1 includes the substrate 10, the ground electrode 20, a radiation electrode 30, the feed line 50, and a RF signal processing circuit (RFIC) 80. The ground electrode 20, the radiation electrode 30, the feed line 50, and the RF signal processing circuit (RFIC) 80 are each provided on the substrate 10.

The substrate 10 is, for example, a dielectric substrate, and the radiation electrode 30 and the RF signal processing circuit 80 are unified by providing the radiation electrode 30 on one of the principal surfaces of the substrate 10 and providing the RF signal processing circuit 80 on the other principal surface. The substrate 10 has such a structure that an area between the radiation electrode 30 and the ground electrode 20 is filled with a dielectric material. Note that this area is also referred to as the antenna area 60 because the antenna characteristic can change depending on the volume of this area, which is filled with a dielectric material and positioned between the radiation electrode 30 and the ground electrode 20. In FIG. 1A and FIG. 1B, for clarification of the inside of the antenna area 60, the antenna area 60 is made transparent. Further, an area between the ground electrode 20 and the RF signal processing circuit 80 is an area in which wiring for the RF signal processing circuit is provided, and thus, this area is also referred to as the wiring area 70. Note that the substrate 10 may alternatively be, for example, a low temperature co-fired ceramics (LTCC) substrate, a printed circuit board, or the like.

The RF signal processing circuit 80 is a circuit for processing a radio frequency signal received or to be transmitted from the radiation electrode 30. The RF signal processing circuit 80 is connected to the radiation electrode 30 via the feed line 50. The RF signal processing circuit 80 is, for example, made up of a single package.

The ground electrode 20 is provided on the substrate 10 above the RF signal processing circuit 80. The ground electrode 20 is provided on the substrate 10 in such a manner as to face the radiation electrode 30 in a direction vertical to the principal surface of the substrate 10 and is set at a ground electric potential.

The radiation electrode 30 is, for example, a patch antenna and provided on the substrate 10 above the ground electrode 20 in such a manner as to at least partially overlap with the RF signal processing circuit 80 in the plan view of the substrate 10. FIG. 1C illustrates, as an overlapping area 40, an area where the radiation electrode 30 and the RF signal processing circuit 80 overlap in the plan view of the substrate 10, which is a view of the substrate 10 from the plus direction (from above) of the z-axis. The radiation electrode 30 is a conductor pattern formed on the substrate 10 in such a manner as to be substantially parallel to the principal surface of the substrate 10 and receives a radio frequency signal from the RF signal processing circuit 80 via the feed line 50. The radiation electrode 30 is also a radiating element that radiates a radio wave (radio frequency signal propagates through space) corresponding to a radio frequency signal sent between the radiation electrode 30 and the RF signal processing circuit 80 and is also a receiving element that receives such a radio wave. The radiation electrode 30 has, for example, a rectangular shape in the plan view of the substrate 10, and may alternatively have a circular shape, a polygonal shape, or the like.

Further, the radiation electrode 30 and the ground electrode 20 are each, for example, composed of Al, Cu, Au, Ag, or a metal film whose main component is an alloy of any of these metals.

The ground electrode 20 includes a first ground pattern 23, a second ground pattern 21 provided above the first ground pattern 23 and within the first ground pattern 23 in the plan view of the substrate 10, and at least one ground conductor that connects the first ground pattern 23 and the second ground pattern 21. The first ground pattern 23 and the second ground pattern 21 are conductor patterns formed on the substrate 10 in such a manner as to be substantially parallel to the substrate 10.

The at least one ground conductor is, for example, the peripheral wall 22 (single ground conductor). Specifically, the peripheral wall 22 connects the first ground pattern 23 and an outer edge portion of the second ground pattern 21. The peripheral wall 22 is provided in such a manner as to surround part of the feed line 50 and extends in a direction substantially parallel to a direction in which the feed line 50 extends.

The second ground pattern 21 has a through hole 24 through which the feed line 50 penetrates and is substantially orthogonal to a direction in which the feed line 50 extends. The second ground pattern 21 is provided at least within the radiation electrode 30 in the plan view of the substrate 10. In the present embodiment, the second ground pattern 21 is provided only within the radiation electrode 30 in that plan view. The peripheral wall 22 is also provided only within the radiation electrode 30 in that plan view because the peripheral wall 22 is connected to the outer edge portion of the second ground pattern 21.

The first ground pattern 23 has substantially the same size as the principal surface of the substrate 10 and includes the radiation electrode 30 therein in that plan view. In other words, the first ground pattern 23 is provided in such a manner as to expand out of the radiation electrode 30 in that plan view. The first ground pattern 23 has a through hole 25 through which the feed line 50 penetrates and is substantially orthogonal to a direction in which the feed line 50 extends.

Configuring the ground electrode 20 in the way described above enables to make a distance h1 longer than a distance h2, where the distance h1 is the distance between the radiation electrode 30 and the first ground pattern 23 outside the radiation electrode 30 in the plan view of the substrate 10, and the distance h2 is the distance between the radiation electrode 30 and the second ground pattern 21 inside the radiation electrode 30 in that plan view. Although the details will be described below, this enables the improvement of the antenna characteristic.

The feed line 50 is provided in the overlapping area 40 and is a conductor via that electrically connects the radiation electrode 30 and the RF signal processing circuit 80. The feed line 50 connects the radiation electrode 30 and the RF signal processing circuit 80 through the through holes 24 and 25 in such a manner as not to be in contact with the ground electrode 20 provided between the radiation electrode 30 and the RF signal processing circuit 80. Providing the feed line 50 in the overlapping area 40 where the radiation electrode 30 and the RF signal processing circuit 80 overlap enables the feed line 50 to be formed in the direction vertical to the first ground pattern of the substrate 10, thereby enabling to make the feed line 50 shorter. This enables to reduce the transmission line loss originated from the feed line 50 and improve the antenna gain.

[2. Comparison Example]

Next, a comparison example of the antenna module 1 according to the embodiment 1 is described with reference to FIG. 2.

FIG. 2 is a cross-sectional view of an antenna module 1a according to the comparison example. In the antenna module 1a according to the comparison example, the ground electrode 20a does not have the second ground pattern 21 or the peripheral wall 22. Further, the antenna module 1a is different from the antenna module 1 in that the ground electrode 20a has a flat face at the height of the second ground pattern 21 of the antenna module 1. Further, because the ground electrode 20a does not have the second ground pattern 21 or the peripheral wall 22, the height of the antenna area 60a is constant in the substrate 10a, and the distance between the edge portion of the radiation electrode 30 and the ground electrode 20a is equal to the distance h2. On the other hand, because the ground electrode 20a has a flat face at the height of the second ground pattern 21 of the antenna module 1, the wiring area 70a is larger than the wiring area 70. The remaining point is similar to that of the antenna module 1, and thus the description thereof is omitted.

[3. Advantageous Effect]

Here, advantageous effects produced by the antenna module 1 according to the embodiment 1 are described with reference to FIG. 3 while comparing with the antenna module 1a according to the comparison example.

FIG. 3 is a diagram illustrating the antenna characteristic of the embodiment 1 and the antenna characteristic of the comparison example.

The distance h1 between the edge portion of the radiation electrode 30 and the ground electrode 20 in the embodiment 1 is longer than the distance h2 between the end portion of the radiation electrode 30 and the ground electrode 20a in the comparison example. Therefore, the density of lines of electric force in the antenna area 60 decreases, and as illustrated in FIG. 3, it is found that the antenna characteristic is improved in the embodiment 1 compared with the comparison example. Specifically, it is found that with respect to the antenna characteristic, the bandwidth where voltage standing wave ratio (VSWR) is equal to 2 or less is expanded. Specifically, the bandwidth where VSWR is 2 (return loss is 9.542 dB) is 1.622 GHz in the comparison example, whereas the bandwidth where VSWR is 2 is 2.121 GHz in the embodiment 1, and thus the bandwidth is expanded by 0.499 GHz.

Accordingly, the thickness of the substrate 10 can be reduced (that is, the feed line 50 can be shortened) by the amount of improvement in the antenna characteristic. Therefore, this enables to suppress the influence of polarization in the substrate thickness direction originated from the feed line 50 while maintaining the antenna characteristic of the antenna module 1a according to the comparison example. Note that in the embodiment 1, part of the wiring area 70a is allocated to the antenna area 60 because the whole area of the wiring area 70a in the comparison example is not needed as the size of the area where wiring for the RF signal processing circuit 80 is provided.

At this time, it is conceivable to make the ground electrode 20a in the comparison example have a flat face at the height of the first ground pattern 23 instead of the height of the second ground pattern 21 of the ground electrode 20 in the embodiment 1. In this case, however, a feed line 51 existing on the side closer to the radiation electrode 30 than the ground electrode 20a becomes longer, compared with the ground electrode 20 in which part of the feed line 50 is covered with the peripheral wall 22 and the second ground pattern 21. The polarization in the substrate thickness direction originated from a feed line 52 existing on the side closer to the RF signal processing circuit 80 than the ground electrode 20a is shielded by the ground electrode 20a, thereby causing less influence on the radiation electrode 30. However, in the case where the feed line 51 existing on the side closer to the radiation electrode 30 than the ground electrode 20a becomes longer, the influence on the radiation electrode 30 due to the polarization in the substrate thickness direction originated from the feed line 50 also becomes larger. Accordingly, as the part of the feed line 50 covered by the ground electrode 20 with the peripheral wall 22 and the second ground pattern 21 increases, the feed line 51 existing on the side closer to the radiation electrode 30 than the ground electrode 20 becomes shorter, thereby enabling to suppress the influence of polarization in the substrate thickness direction originated from the feed line 50.

Note that enabling to suppress the influence of polarization in the substrate thickness direction originated from the feed line 50 while maintaining the antenna characteristic means, in other words, also enabling to produce the advantageous effect of improving the antenna characteristic while maintaining the influence of polarization in the substrate thickness direction originated from the feed line 50.

Further, compared with the comparison example, in the embodiment 1, the distance between the RF signal processing circuit 80 and the ground electrode 20 becomes shorter, and this improves the heat dissipation effect for the heat generated by the RF signal processing circuit 80.

Further, the ground electrode 20 has the peripheral wall 22 provided in such a manner as to be substantially parallel to the feed line 50, and this enables to reduce radiation loss and improve the antenna gain.

Further, the ground electrode 20 having a step-like shape is buried inside the substrate 10, and this enables to hinder warping of the substrate 10 and improve coplanarity of the substrate 10.

Further, the second ground pattern 21 is provided only within the radiation electrode 30 in the plan view of the substrate 10.

According to this, in the case where the second ground pattern 21, which is close to the radiation electrode 30, is expanded to the outside of the radiation electrode 30 in the plan view of the substrate 10, the distance between the ground electrode 20 and the edge portion of the radiation electrode 30 becomes shorter, and this hinders the improvement of the antenna characteristic. Accordingly, by providing the second ground pattern 21 only within the radiation electrode 30 in the plan view of the substrate 10, the distance h2 between the ground electrode 20 and the edge portion of the radiation electrode 30 is secured, and the antenna characteristic improves. As a result, the feed line 50 can be further shortened, and the influence of polarization in the substrate thickness direction originated from the feed line 50 can be further suppressed.

Note that the size of the second ground pattern 21 can be expanded close to the edge portion of the radiation electrode 30 in the plan view of the substrate 10 to the extent that the antenna characteristic does not degrade. Although the wiring area 70 in which wiring for the RF signal processing circuit 80 is provided is necessary in the substrate 10, according to this, the area covered by the second ground pattern 21 and the peripheral wall 22 becomes larger by expanding the size of the second ground pattern 21 close to the edge portion of the radiation electrode 30 in that plan view, and the wiring area 70 can be secured in that area while improving the antenna characteristic.

Embodiment 2

The antenna module 1 according to the embodiment 1 includes a single radiation electrode 30. However, the present disclosure may also be applied to an antenna module that includes an array antenna including a plurality of radiation electrodes 30, in which the plurality of radiation electrodes 30 is arranged in an array on a substrate. In the antenna module including an array antenna that facilitates control of the antenna directivity, degradation of XPD can be suppressed by suppressing the influence of polarization in the substrate thickness direction originated from the feed line 50. Hereinafter, an antenna module according to the embodiment 2 is described with reference to FIG. 4 and FIG. 5.

Figure 4:
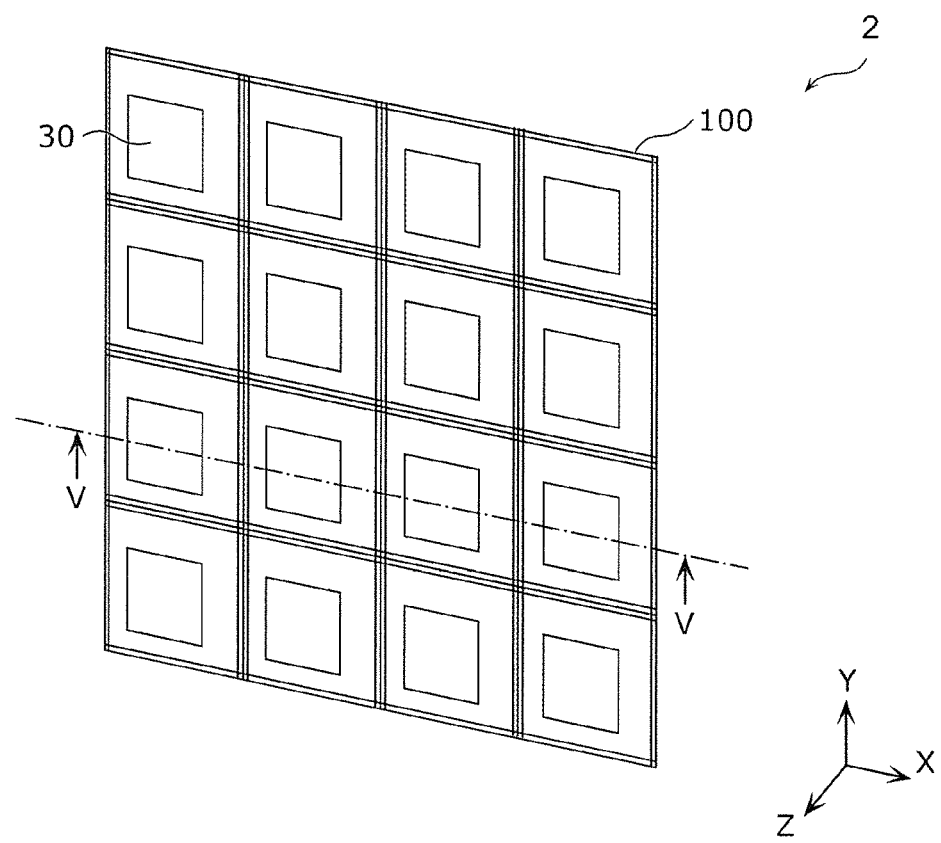
FIG. 4 is an external perspective view of an antenna module according to an embodiment 2.
Figure 5:
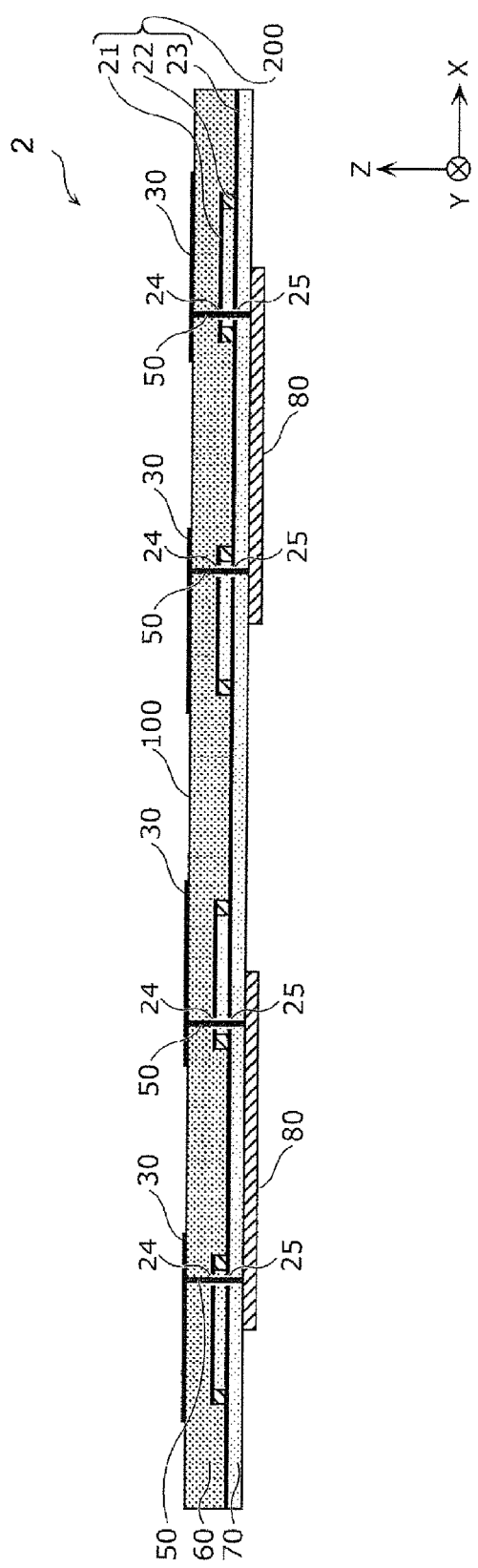
FIG. 5 is a cross-sectional view of the antenna module according to the embodiment 2.

FIG. 4 is an external perspective view of an antenna module 2 according to the embodiment 2. FIG. 5 is a cross-sectional view of the antenna module 2 according to the embodiment 2. FIG. 5 is a V-V cross-sectional view of the antenna module 2 in FIG. 4.

As illustrated in FIG. 4, the antenna module 2 includes a plurality of radiation electrodes 30, and the plurality of radiation electrodes 30 are arranged in an array on a substrate 100. In the present embodiment, the array antenna is made up of 16 radiation electrodes 30 arranged two-dimensionally in an array of 4×4.

Note that the number and the arrangement of the radiation electrodes 30 that make up the array antenna are not limited thereto, and the plurality of radiation electrodes 30 may alternatively be arrayed, for example, one-dimensionally. Further, the plurality of radiation electrodes 30 may not be necessarily arranged linearly in a row direction or a column direction and may alternatively be arranged, for example, in a staggered manner.

As illustrated in FIG. 5, a ground electrode 200 includes second ground patterns 21 and peripheral walls 22 for respective ones of the plurality of radiation electrodes 30, and the influence of polarization in the substrate thickness direction originated from the feed line 50 connected to each of the radiation electrodes 30 is suppressed. This enables to suppress polarization in a direction parallel to a first ground pattern of the substrate 100 (a left-right direction and a front-back direction in the page of FIG. 5), which is originated from the polarization in the substrate thickness direction, thereby enabling to suppress the degradation of XPD in the array antenna.

Note that a single radiation electrode 30 may receive power from two feed points that are provided on this radiation electrode 30 at positions different from each other. This enables to radiate radio waves having two polarization directions different from each other. Further, for example, a single RF signal processing circuit 80 feeds a radio frequency signal to four radiation electrodes 30 (for example, four radiation electrodes 30 arranged two-dimensionally in an array of 2×2). Accordingly, for example, eight feed lines 50 are connected to the single RF signal processing circuit 80 for feeding power to the four radiation electrodes 30.

As described above, the antenna module 2 including an array antenna that facilitates the control of the antenna directivity can be provided, and in this array antenna, the polarization in the substrate thickness direction originated from the feed line 50 can be suppressed, thereby enabling to suppress the degradation of XPD.

Note that although the RF signal processing circuit 80 is provided on the other principal surface of the substrate 100, the RF signal processing circuit 80 may alternatively be provided inside the substrate 100. This is described using FIG. 6.

Figure 6:
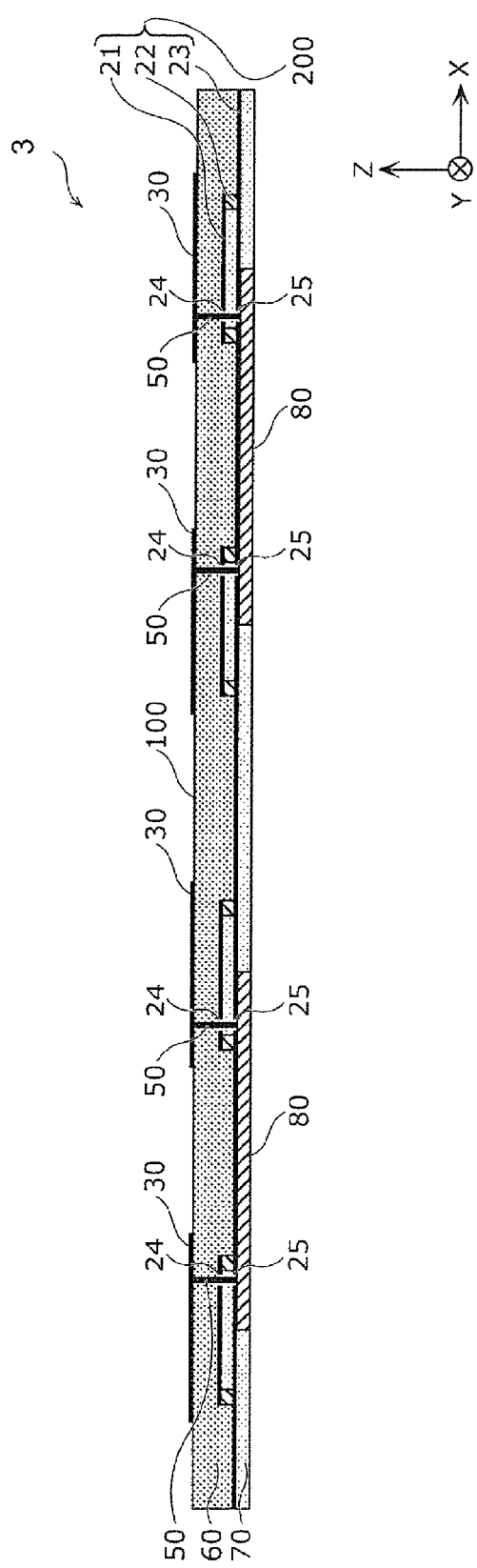
FIG. 6 is a cross-sectional view of an antenna module according to a modified example of the embodiment 2.

FIG. 6 is a cross-sectional view of an antenna module 3 according to a modified example of the embodiment 2.

As illustrated in FIG. 6, in the antenna module 3, the RF signal processing circuit 80 is provided inside the substrate 100. For example, the wiring area in which wiring for the RF signal processing circuit 80 is provided can be secured in the area covered by the second ground pattern 21 and the peripheral wall 22. Therefore, the RF signal processing circuit 80 can be provided inside the substrate 100. This enables further downsizing (lowering of profile height) of the antenna module 3.

Embodiment 3

In the antenna modules according to the embodiments 1 and 2, the radiation electrode 30 is illustrated as a single pattern conductor. However, the radiation electrode 30 may alternatively be made up of a feed element 31 connected to the feed line 50 and a parasitic element 32 that is not connected to the feed line 50. The parasitic element 32 is provided above the feed element 31 and separated from the feed element 31.

Figure 7:
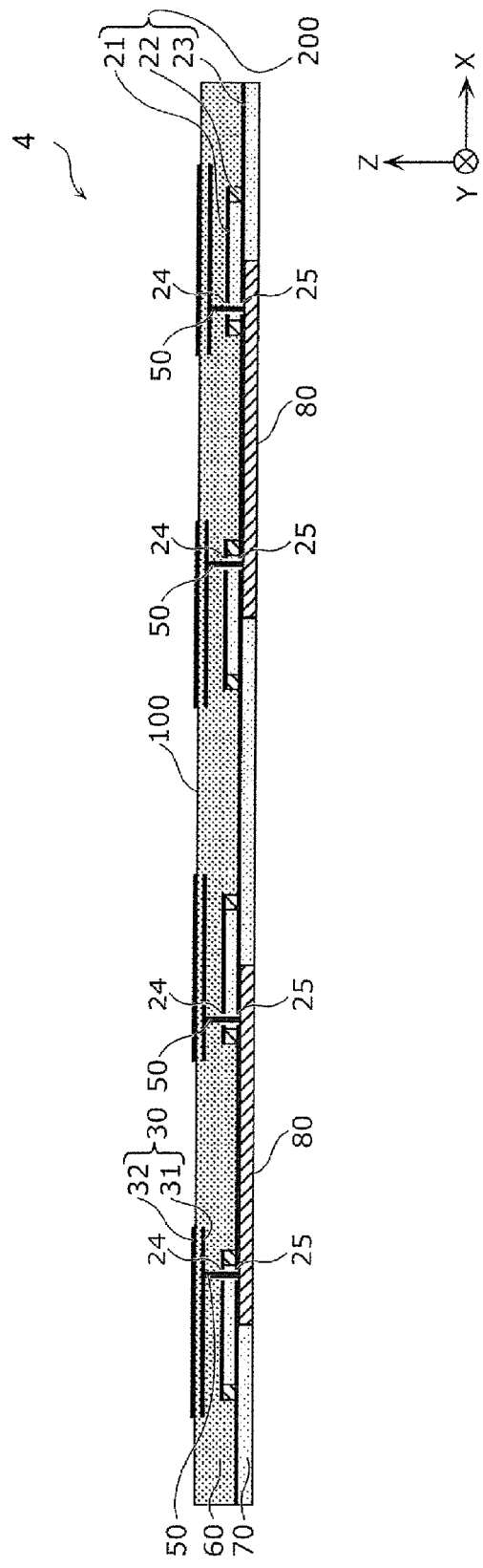
FIG. 7 is a cross-sectional view of an antenna module according to an embodiment 3.

FIG. 7 is a cross-sectional view of an antenna module 3 according to the embodiment 3.

As illustrated in FIG. 7, by providing the parasitic element 32 above the feed element 31 and separating from the feed element 31, the parasitic element 32 can function as a wave director, thereby enabling to increase the antenna directivity. Further, adjustment of the distance between the feed element 31 and the parasitic element 32 enables to control the antenna directivity.

Further, the material of the substrate 100 between the feed element 31 and the parasitic element 32 is different from the material of the substrate 100 between the feed element 31 and the ground electrode 200. This enables to make the thermal expansion coefficient in between the feed element 31 and the parasitic element 32 different from the thermal expansion coefficient in between the feed element 31 and the ground electrode 200. Accordingly, warping of the substrate 100 is alleviated, and the coplanarity of the substrate 100 can be improved.

Embodiment 4

The antenna modules described in the foregoing embodiments are applicable to communication devices. Hereinafter, a communication device 6 in which the antenna module 2 according to the embodiment 2 is described.

Figure 8:
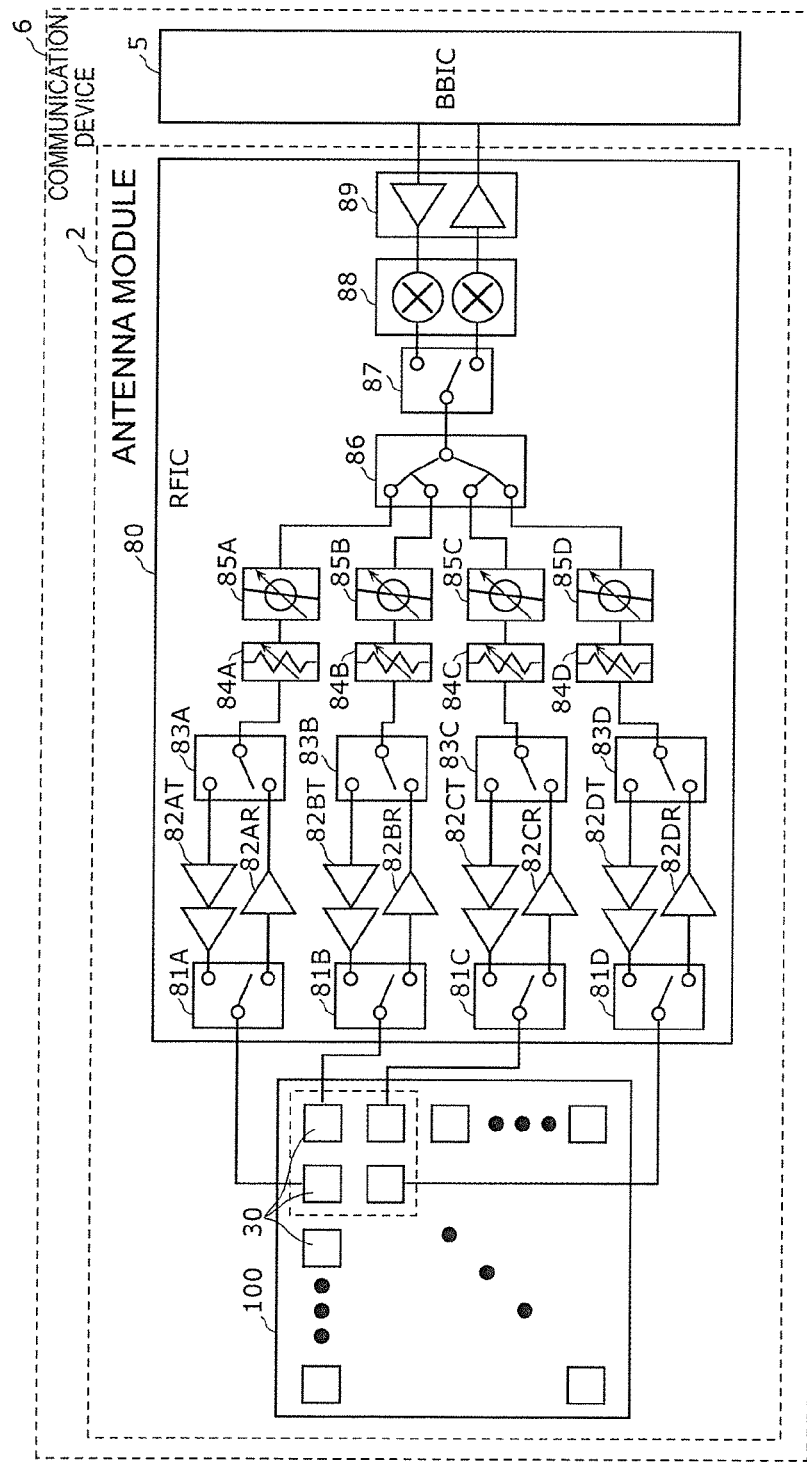
FIG. 8 is a circuit diagram of a communication device according to an embodiment 4.

FIG. 8 is a circuit diagram of the communication device 6 according to the embodiment 4. The communication module 6 illustrated in FIG. 8 includes the antenna module 2 and a base band signal processing circuit (BBIC) 5. The communication device 6 up-converts a signal sent from the base band signal processing circuit 5 to the antenna module 2 into a radio frequency signal and radiates it from a plurality of radiation electrodes 30 (array antenna), and also down-converts a radio frequency signal received by the array antenna and performs signal processing at the base band signal processing circuit 5.

The RF signal processing circuit 80 includes switches 81A to 81D, 83A to 83D, and 87, power amplifier 82AT to 82DT, low noise amplifiers 82AR to 82DR, attenuators 84A to 84D, phase shifters 85A to 85D, a signal multiplexer/demultiplexer 86, a mixer 88, and an amplifier circuit 89.

The switches 81A to 81D and 83A to 83D are each a switch circuit that switches between transmitting and receiving at each signal path.

A signal sent from the base band signal processing circuit 5 is amplified at the amplifier circuit 89 and up-converted at the mixer 88. An up-converted radio frequency signal is split into four signals at the signal multiplexer/demultiplexer 86 and fed to the respective radiation electrodes 30 that are different from each other after going through four transmitting signal paths. At this time, the adjustment of the array antenna directivity is made possible by individually adjusting the degrees of phase shift of the phase shifters 85A to 85D arranged in the respective signal paths.

Further, radio frequency signals received by the respective radiation electrodes 30 are sent via four different receiving paths, multiplexed at the signal multiplexer/demultiplexer 86, down-converted at the mixer 88, amplified at the amplifier circuit 89, and sent to the base band signal processing circuit 5.

The RF signal processing circuit 80 is formed as, for example, a one-chip integrated circuit component including the foregoing circuit configuration.

Note that the RF signal processing circuit 80 may not necessarily include any one of the switches 81A to 81D, 83A to 83D, and 87, the power amplifier 82AT to 82DT, the low noise amplifiers 82AR to 82DR, the attenuators 84A to 84D, the phase shifters 85A to 85D, the signal multiplexer/demultiplexer 86, the mixer 88, and the amplifier circuit 89, which are described above. Further, the RF signal processing circuit 80 may include only one of the transmitting path and the receiving path. Further, the antenna module 2 according to the present embodiment is applicable to a system not only transmitting and receiving a radio frequency signal of a single frequency band (a band) but also transmitting and receiving radio frequency signals of a plurality of frequency bands (multiband). Accordingly, as illustrated in FIG. 5, the antenna module 2 according to the present embodiment has the configuration in which two or more systems of circuit configurations, which are included in the RF signal processing circuit 80, are installed and the switches switch these circuit configurations.

Other Embodiments

The antenna modules according to the embodiments of the present disclosure are described using the foregoing embodiments. However, the present disclosure is not limited to the foregoing embodiments. Other embodiments realized by combining arbitrary constituting elements of the foregoing embodiments and modified examples obtained by applying various modifications conceivable to those skilled in the art to the foregoing embodiments without departing the scope of the present disclosure may also be included in the present disclosure.

For example, in the foregoing embodiments, the at least one ground conductor in the ground electrodes 20 and 200 are the peripheral wall 22. However, the at least one ground conductor is not limited to a single wall configuration such as the peripheral wall 22. This is described using FIG. 9A and FIG. 9B.

FIG. 9A is an external perspective view of an antenna module 5 according to another embodiment. As in FIG. 1A, in FIG. 9A, for clarification of the inside of an antenna area 60 in the substrate 10, the antenna area 60 is made transparent, and edge portions thereof are illustrated by the dashed line. Further, FIG. 9A illustrates an enlarged view of the vicinity of a ground electrode 201 (an area enclosed by a dashed line thicker than the dashed line illustrating the foregoing edge portions), which will be described below.

FIG. 9B is a cross-sectional view of the antenna module 5 according to another embodiment.

The configuration of the antenna module 5 is the same as the configuration of the antenna module 1 except that the ground electrode 20 of the antenna module 1 is replaced with the ground electrode 201, and thus the description regarding the same point as that of the antenna module 1 is omitted.

For example, as illustrated in FIG. 9A and FIG. 9B, at least one ground conductor of the ground electrode 201 may be a plurality of via conductors (ground conductors) 22a arranged in such a manner as to surround the feed line 50. The plurality of via conductors 22a is provided in such a manner as to surround part (feed line 52) of the feed line 50 and extends in a direction substantially parallel to a direction in which the feed line 50 extends.

Even with this configuration, the ground electrode 201 can shield the polarization in the substrate thickness direction originated from the feed line 50. Further, in this configuration, the pitch with which the plurality of via conductors 22a is arranged is, for example, less than or equal to ¼ of an in-substrate wavelength λg of a radio frequency signal fed by the feed line 50.

Further, as illustrated in FIG. 9A and FIG. 9B, the wiring area 70 may also be covered by via conductors 71.

Further, for example, in the embodiment 1, the RF signal processing circuit 80 is provided on the other principal surface of the substrate 10. However, the RF signal processing circuit 80 may alternatively be provided inside the substrate 10.

Further, in the foregoing embodiments, the second ground pattern 21 is provided only within the radiation electrode 30 in the plan view of the substrate 10 (100). However, the second ground pattern 21 may alternatively be provided outside the radiation electrode 30. In other words, the second ground pattern 21 may be provided in such a manner as to expand out of the radiation electrode 30 in that plan view. This enables to secure a larger area in which wiring for the RF signal processing circuit 80 is provided.

Further, for example, the antenna module according to the foregoing embodiment is also applicable to a Massive MIMO system. One of promising wireless transmission techniques in 5G (fifth generation mobile communication system) is a combination of phantom cells and the Massive MIMO system. The phantom cell is a network configuration that separates a data signal being a subject of high-speed data communication from a control signal for ensuring stability of communication between a macro cell of a low frequency band and a small cell of a high frequency band. An antenna device of Massive MIMO is provided in each phantom cell. The Massive MIMO system is a technology for improving transmission quality in a millimeter wave band or the like and controls the antenna directivity by controlling a signal transmitted from each radiation electrode 30. Further, the Massive MIMO system uses a large number of radiation electrodes 30, thereby enabling to form a sharply directed beam. Increasing the beam directivity enables to send a radio wave over a rather far distance even in a high frequency band and increase frequency utilization efficiency by reducing interference between cells.

The present disclosure can be widely used in communication equipment of a millimeter wave band mobile communication system, a Massive MIMO system, and the like, as an antenna module enabling the suppression of the influence of polarization in the substrate thickness direction originated from the feed line.

1, 1a, 2, 3, 4 Antenna module
5 Base band signal processing circuit (BBIC)
6 Communication device
10, 10a, 100 Substrate
20, 20a, 200, 201 Ground electrode
21 Second ground pattern
22 Peripheral wall (ground conductor)
22a Via conductor (ground conductor)
23 First ground pattern
24, 25 Through hole
30 Radiation electrode
31 Feed element
32 Parasitic element
40 Overlapping area
50, 51, 52 Feed line
60, 60a Antenna area
70, 70a Wiring area
71 Via conductor
80 RF signal processing circuit (RFIC)
81A, 81B, 81C, 81D, 83A, 83B, 83C, 83D, 87 Switch
82AR, 82BR, 82CR, 82DR Low noise amplifier
82AT, 82BT, 82CT, 82DT Power amplifier
84A, 84B, 84C, 84D Attenuator
85A, 85B, 85C, 85D Phase shifter
86 Signal multiplexer/demultiplexer
88 Mixer
89 Amplifier circuit

The invention claimed is:

1. An antenna module comprising:
a substrate;
a radio frequency (RF) signal processing circuit provided on the substrate;
a ground electrode provided on the substrate above the RF signal processing circuit;
one or more radiation electrodes provided on the substrate above the ground electrode in such a manner as to overlap with the RF signal processing circuit at least partially in a plan view of the substrate; and
a feed line provided in an overlapping area where the one or more radiation electrodes and the RF signal processing circuit overlap, the feed line connecting the one or more radiation electrodes and the RF signal processing circuit, wherein
the ground electrode includes a first ground pattern, a second ground pattern provided above the first ground pattern and within the first ground pattern in the plan view, and at least one ground conductor connecting the first ground pattern and the second ground pattern, the second ground pattern being disposed between the one or more radiation electrodes and the first ground pattern,
the at least one ground conductor surrounds a part of the feed line, and
the second ground pattern has a through hole through which the feed line penetrates.

2. The antenna module according to claim 1, wherein the second ground pattern is provided only within the one or more radiation electrodes in the plan view.

3. The antenna module according to claim 2, wherein the one or more radiation electrodes include a plurality of radiation electrodes, and
the plurality of radiation electrodes are arranged on the substrate in an array.

4. The antenna module according to claim 2, wherein the RF signal processing circuit is provided within the substrate.

5. The antenna module according to claim 2, wherein the radiation electrode comprises a feed element connected to the feed line and a parasitic element provided above the feed element.

6. The antenna module according to claim 2, wherein the RF signal processing circuit includes
a phase shifter circuit configured to shift a phase of a radio frequency signal,
an amplifier circuit configured to amplify a radio frequency signal having a shifted phase, and
a switching element configured to switch between feeding and not feeding of an amplified radio frequency signal to the one or more radiation electrodes.

7. The antenna module according to claim 1, wherein the one or more radiation electrodes include a plurality of radiation electrodes, and
the plurality of radiation electrodes are arranged on the substrate in an array.

8. The antenna module according to claim 7, wherein the RF signal processing circuit is provided within the substrate.

9. The antenna module according to claim 7, wherein one or more of the plurality of radiation electrodes comprises a feed element connected to the feed line and a parasitic element provided above the feed element.

10. The antenna module according to claim 7, wherein the RF signal processing circuit includes
a phase shifter circuit configured to shift a phase of a radio frequency signal,
an amplifier circuit configured to amplify a radio frequency signal having a shifted phase, and
a switching element configured to switch between feeding and not feeding of an amplified radio frequency signal to one or more of the plurality of radiation electrodes.

11. The antenna module according to claim 1, wherein the RF signal processing circuit is provided within the substrate.

12. The antenna module according to claim 11, wherein the one or more radiation electrodes comprises a feed element connected to the feed line and a parasitic element provided above the feed element.

13. The antenna module according to claim 11, wherein the RF signal processing circuit includes
a phase shifter circuit configured to shift a phase of a radio frequency signal,
an amplifier circuit configured to amplify a radio frequency signal having a shifted phase, and
a switching element configured to switch between feeding and not feeding of an amplified radio frequency signal to the one or more radiation electrodes.

14. The antenna module according to claim 1, wherein the one or more radiation electrodes comprise a feed element connected to the feed line and a parasitic element provided above the feed element.

15. The antenna module according to claim 14, wherein a material of a portion of the substrate between the feed element and the parasitic element is different from a material of a portion of the substrate between the feed element and the ground electrode.

16. The antenna module according to claim 15, wherein the RF signal processing circuit includes
- a phase shifter circuit configured to shift a phase of a radio frequency signal,
- an amplifier circuit configured to amplify a radio frequency signal having a shifted phase, and
- a switching element configured to switch between feeding and not feeding of an amplified radio frequency signal to the one or more radiation electrodes.

17. The antenna module according to claim 14, wherein the RF signal processing circuit includes
- a phase shifter circuit configured to shift a phase of a radio frequency signal,
- an amplifier circuit configured to amplify a radio frequency signal having a shifted phase, and
- a switching element configured to switch between feeding and not feeding of an amplified radio frequency signal to the one or more radiation electrodes.

18. The antenna module according to claim 1, wherein the RF signal processing circuit includes
- a phase shifter circuit configured to shift a phase of a radio frequency signal,
- an amplifier circuit configured to amplify a radio frequency signal having a shifted phase, and
- a switching element configured to switch between feeding and not feeding of an amplified radio frequency signal to the one or more radiation electrodes.

19. The antenna module according to claim 1, wherein the second ground pattern overlaps the first ground pattern in the plan view.

* * * * *